(12) United States Patent
Margomenos

(10) Patent No.: US 7,830,301 B2
(45) Date of Patent: Nov. 9, 2010

(54) DUAL-BAND ANTENNA ARRAY AND RF FRONT-END FOR AUTOMOTIVE RADARS

(75) Inventor: Alexandros Margomenos, Ann Arbor, MI (US)

(73) Assignee: Toyota Motor Engineering & Manufacturing North America, Inc., Erlanger, KY (US)

(*) Notice: Subject to any disclaimer, the term of this patent is extended or adjusted under 35 U.S.C. 154(b) by 39 days.

(21) Appl. No.: 12/340,448

(22) Filed: Dec. 19, 2008

(65) Prior Publication Data

US 2009/0251356 A1    Oct. 8, 2009

Related U.S. Application Data

(63) Continuation-in-part of application No. 12/098,283, filed on Apr. 4, 2008, now Pat. No. 7,733,265.

(51) Int. Cl.
G01S 13/93 (2006.01)
G01S 7/02 (2006.01)
G01S 13/00 (2006.01)

(52) U.S. Cl. ............... 342/70; 342/27; 342/175; 342/188; 342/195; 342/368; 343/700 R; 343/711; 343/872; 343/700 MS

(58) Field of Classification Search .......... 342/27, 342/28, 70–81, 175, 195, 361–377, 59, 82, 342/89–103, 118, 128–133, 188, 192–197; 343/711–717, 700 MS, 700 R, 793, 810, 343/812, 815, 817, 818, 833–840, 872, 873; 701/300, 301

See application file for complete search history.

(56) References Cited

U.S. PATENT DOCUMENTS 3,686,596 A    8/1972    Albee
4,494,083 A    1/1985    Josefsson et al.

(Continued)

FOREIGN PATENT DOCUMENTS

CN    101145627    3/2008

(Continued)

OTHER PUBLICATIONS

U.S. Appl. No. 12/249,470, filed Apr. 24, 2009, Margomenos.

(Continued)

*Primary Examiner*—Bernarr E Gregory
(74) *Attorney, Agent, or Firm*—Snell & Wilmer, L.L.P.

(57) ABSTRACT

The automotive radar includes a printed circuit board having a top surface and a bottom surface, and a processor mounted on the bottom surface of the printed circuit board. The automotive radar also includes a second liquid crystal polymer layer formed on the top surface of the printed circuit board, a second microstrip array printed on the second liquid crystal polymer layer, the second microstrip array having a patch, a first liquid crystal polymer layer formed on the second liquid crystal polymer layer, a first microstrip array printed on the first liquid crystal polymer layer, the first microstrip array having a perforated patch, and a transmit/receive module connected to a bottom surface of the second liquid crystal polymer layer and configured to transmit a first frequency signal to the first microstrip array and a second frequency signal to the second microstrip array.

21 Claims, 5 Drawing Sheets

U.S. PATENT DOCUMENTS

| | | | |
|---|---|---|---|
| 4,623,894 A | 11/1986 | Lee et al. | |
| 4,786,913 A | 11/1988 | Barendregt et al. | |
| 4,893,126 A * | 1/1990 | Evans | 342/175 |
| 5,115,245 A | 5/1992 | Wen et al. | |
| 5,124,713 A | 6/1992 | Mayes et al. | |
| 5,153,600 A | 10/1992 | Metzler et al. | |
| 5,220,335 A | 6/1993 | Huang | |
| 5,307,075 A | 4/1994 | Huynh | |
| 5,376,902 A | 12/1994 | Bockelman et al. | |
| 5,392,152 A * | 2/1995 | Higgins et al. | 342/175 |
| 5,436,453 A | 7/1995 | Chang et al. | |
| 5,455,589 A * | 10/1995 | Huguenin et al. | 342/175 |
| 5,485,167 A | 1/1996 | Wong et al. | |
| 5,495,262 A | 2/1996 | Klebe | |
| 5,511,238 A * | 4/1996 | Bayraktaroglu | 343/700 MS |
| 5,512,901 A | 4/1996 | Chen et al. | |
| 5,554,865 A | 9/1996 | Larson | |
| 5,561,405 A | 10/1996 | Hoffmeister et al. | |
| 5,583,511 A | 12/1996 | Hulderman | |
| 5,633,615 A | 5/1997 | Quan | |
| 5,657,024 A * | 8/1997 | Shingyoji et al. | 342/175 |
| 5,680,139 A * | 10/1997 | Huguenin et al. | 342/175 |
| 5,767,009 A | 6/1998 | Yoshida et al. | |
| 5,815,112 A | 9/1998 | Sasaki et al. | |
| 5,821,625 A | 10/1998 | Yoshida et al. | |
| 5,877,726 A | 3/1999 | Kudoh et al. | |
| 5,886,671 A | 3/1999 | Riemer et al. | |
| 5,929,802 A | 7/1999 | Russell et al. | |
| 5,943,005 A | 8/1999 | Tanizaki et al. | |
| 5,952,971 A | 9/1999 | Strickland | |
| 5,994,766 A | 11/1999 | Shenoy et al. | |
| 5,999,092 A | 12/1999 | Smith et al. | |
| 6,008,750 A | 12/1999 | Cottle et al. | |
| 6,034,641 A | 3/2000 | Kudoh et al. | |
| 6,037,911 A | 3/2000 | Brankovic et al. | |
| 6,043,772 A | 3/2000 | Voigtlaender et al. | |
| 6,091,355 A * | 7/2000 | Cadotte et al. | 342/175 |
| 6,091,365 A | 7/2000 | Derneryd et al. | |
| 6,107,578 A | 8/2000 | Hashim | |
| 6,107,956 A | 8/2000 | Russell et al. | |
| 6,114,985 A | 9/2000 | Russell et al. | |
| 6,130,640 A | 10/2000 | Uematsu et al. | |
| 6,137,434 A | 10/2000 | Tohya et al. | |
| 6,191,740 B1 | 2/2001 | Kates et al. | |
| 6,232,849 B1 | 5/2001 | Flynn et al. | |
| 6,249,242 B1 | 6/2001 | Sekine et al. | |
| 6,278,400 B1 | 8/2001 | Cassen et al. | |
| 6,281,843 B1 | 8/2001 | Evtioushkine et al. | |
| 6,329,649 B1 | 12/2001 | Jack et al. | |
| 6,359,588 B1 | 3/2002 | Kuntzsch | |
| 6,388,206 B2 | 5/2002 | Dove et al. | |
| 6,452,549 B1 | 9/2002 | Lo | |
| 6,483,481 B1 | 11/2002 | Sievenpiper et al. | |
| 6,483,714 B1 | 11/2002 | Kabumoto et al. | |
| 6,501,415 B1 | 12/2002 | Viana et al. | |
| 6,577,269 B2 | 6/2003 | Woodington et al. | |
| 6,583,753 B1 | 6/2003 | Reed | |
| 6,628,230 B2 | 9/2003 | Mikami et al. | |
| 6,639,558 B2 | 10/2003 | Kellerman et al. | |
| 6,642,819 B1 | 11/2003 | Jain et al. | |
| 6,642,908 B2 | 11/2003 | Pleva et al. | |
| 6,657,518 B1 | 12/2003 | Weller et al. | |
| 6,683,510 B1 | 1/2004 | Padilla | |
| 6,686,867 B1 | 2/2004 | Lissel et al. | |
| 6,727,853 B2 | 4/2004 | Sasada et al. | |
| 6,756,936 B1 * | 6/2004 | Wu | 342/175 |
| 6,784,828 B2 | 8/2004 | Delcheccolo et al. | |
| 6,794,961 B2 | 9/2004 | Nagaishi et al. | |
| 6,795,021 B2 | 9/2004 | Ngai et al. | |
| 6,806,831 B2 | 10/2004 | Johansson et al. | |
| 6,828,556 B2 | 12/2004 | Pobanz et al. | |
| 6,842,140 B2 | 1/2005 | Killen et al. | |
| 6,853,329 B2 | 2/2005 | Shinoda et al. | |
| 6,864,831 B2 | 3/2005 | Woodington et al. | |
| 6,873,250 B2 | 3/2005 | Viana et al. | |
| 6,897,819 B2 | 5/2005 | Henderson et al. | |
| 6,930,639 B2 | 8/2005 | Bauregger et al. | |
| 6,940,547 B1 | 9/2005 | Mine | |
| 6,946,995 B2 | 9/2005 | Choi et al. | |
| 6,987,307 B2 | 1/2006 | White et al. | |
| 6,992,629 B2 | 1/2006 | Kerner et al. | |
| 7,009,551 B1 | 3/2006 | Sapletal et al. | |
| 7,009,562 B2 * | 3/2006 | Jenabi | 343/700 MS |
| 7,015,860 B2 | 3/2006 | Alsliety | |
| 7,019,697 B2 | 3/2006 | du Toit | |
| 7,030,712 B2 | 4/2006 | Brunette et al. | |
| 7,034,753 B1 | 4/2006 | Elsallal et al. | |
| 7,071,889 B2 | 7/2006 | McKinzie, III et al. | |
| 7,081,847 B2 | 7/2006 | Ziller et al. | |
| 7,098,842 B2 | 8/2006 | Nakazawa et al. | |
| 7,102,571 B2 | 9/2006 | McCarrick | |
| 7,106,264 B2 | 9/2006 | Lee et al. | |
| 7,109,917 B2 * | 9/2006 | Schmidt et al. | 342/175 |
| 7,109,922 B2 | 9/2006 | Shmuel | |
| 7,109,926 B2 | 9/2006 | du Toit | |
| 7,154,356 B2 | 12/2006 | Brunette et al. | |
| 7,177,549 B2 | 2/2007 | Matsushima et al. | |
| 7,180,440 B2 * | 2/2007 | Schmidt et al. | 342/175 |
| 7,187,334 B2 | 3/2007 | Franson et al. | |
| 7,193,562 B2 | 3/2007 | Shtrom et al. | |
| 7,215,284 B2 | 5/2007 | Collinson | |
| 7,236,130 B2 | 6/2007 | Voigtlaender | |
| 7,239,779 B2 | 7/2007 | Little | |
| 7,268,732 B2 | 9/2007 | Gotzig et al. | |
| 7,292,125 B2 | 11/2007 | Mansour et al. | |
| 7,307,581 B2 | 12/2007 | Sasada | |
| 7,331,723 B2 | 2/2008 | Yoon et al. | |
| 7,336,221 B2 | 2/2008 | Matsuo et al. | |
| 7,355,547 B2 | 4/2008 | Nakazawa et al. | |
| 7,358,497 B1 | 4/2008 | Boreman et al. | |
| 7,362,259 B2 | 4/2008 | Gottwald | |
| 7,388,279 B2 | 6/2008 | Fjelstad et al. | |
| 7,411,542 B2 | 8/2008 | O'Boyle | |
| 7,414,569 B2 | 8/2008 | De Mersseman | |
| 7,436,363 B1 | 10/2008 | Klein et al. | |
| 7,446,696 B2 | 11/2008 | Kondo et al. | |
| 7,456,790 B2 | 11/2008 | Isono et al. | |
| 7,463,122 B2 | 12/2008 | Kushta et al. | |
| 7,489,280 B2 | 2/2009 | Aminzadeh et al. | |
| 7,528,780 B2 | 5/2009 | Thiam et al. | |
| 7,603,097 B2 | 10/2009 | Leblanc et al. | |
| 7,639,173 B1 * | 12/2009 | Wang et al. | 342/28 |
| 2002/0047802 A1 | 4/2002 | Voipio | |
| 2002/0158305 A1 | 10/2002 | Dalmia et al. | |
| 2003/0016162 A1 | 1/2003 | Sasada et al. | |
| 2003/0034916 A1 | 2/2003 | Kwon et al. | |
| 2003/0036349 A1 | 2/2003 | Josefsson et al. | |
| 2004/0028888 A1 | 2/2004 | Lee et al. | |
| 2004/0075604 A1 | 4/2004 | Nakazawa et al. | |
| 2005/0109453 A1 | 5/2005 | Jacobson et al. | |
| 2005/0128122 A1 * | 6/2005 | Schmidt et al. | 342/175 |
| 2005/0156780 A1 * | 7/2005 | Bonthron et al. | 342/70 |
| 2005/0248418 A1 | 11/2005 | Govind et al. | |
| 2006/0044189 A1 | 3/2006 | Livingston et al. | |
| 2006/0152406 A1 | 7/2006 | Leblanc et al. | |
| 2006/0158378 A1 | 7/2006 | Pons et al. | |
| 2006/0250298 A1 | 11/2006 | Nakazawa et al. | |
| 2006/0256026 A1 * | 11/2006 | Gotzig et al. | 342/175 |
| 2006/0267830 A1 | 11/2006 | O'Boyle | |
| 2006/0290564 A1 | 12/2006 | Sasada et al. | |
| 2007/0026567 A1 | 2/2007 | Beer et al. | |
| 2007/0085108 A1 | 4/2007 | White et al. | |
| 2007/0131452 A1 | 6/2007 | Gilliland | |
| 2007/0230149 A1 | 10/2007 | Bibee | |

| 2007/0279287 | A1 | 12/2007 | Castaneda et al. |
| 2007/0285314 | A1 | 12/2007 | Mortazawi et al. |
| 2008/0030416 | A1 | 2/2008 | Lee et al. |
| 2008/0048800 | A1 | 2/2008 | Dutta |
| 2008/0068270 | A1 | 3/2008 | Thiam et al. |
| 2008/0074338 | A1 | 3/2008 | Vacanti |
| 2008/0150821 | A1 | 6/2008 | Koch et al. |
| 2008/0169992 | A1 | 7/2008 | Ortiz et al. |
| 2009/0058731 | A1 | 3/2009 | Geary et al. |
| 2009/0066593 | A1 | 3/2009 | Jared et al. |
| 2009/0102723 | A1 | 4/2009 | Mateychuk et al. |
| 2009/0251362 | A1 | 10/2009 | Margomenos et al. |

FOREIGN PATENT DOCUMENTS

| EP | 1324423 | 7/2003 |
| KR | 777967 | 11/2007 |
| WO | WO 2007/149746 | 12/2007 |
| WO | WO 2008148569 | 12/2008 |

OTHER PUBLICATIONS

U.S. Appl. No. 12/355,526, filed Jan. 16, 2009, Margomenos et al.

Weller, Thomas M., "Three-Dimensional High-Frequency Distribution Networks—Part I: Optimization of CPW Discontinuities", *IEEE Transactions on Microwave Theory and Techniques*, vol. 48, No. 10, pp. 1635-1642, Oct. 2000.

H. Iizuka et al., "Millimeter-Wave Microstrip Array Antenna for Automotive Radars, IEICE Transactions for Communications", vol. E86-B, No. 9, pp. 2728-2738, Sep. 2003.

Margomenos et al., "Isolation in Three-Dimensional Integrated Circuits", *IEEE Transactions on Microwave Theory and Techniques*, vol. 51, issue 1, pp. 25-32, Jan. 2003.

Ponchak et al., "Characterization of the Coupling Between Adjacent Finite Ground Coplanar (FGC) waveguides", *Int. J. Microcircuits Electron. Packag.*, vol. 20, No. 4, pp. 587-592, Nov. 1997.

Ponchak et al., "Coupling Between Microstrip Lines With Finite Width Ground Plane Embedded in Thin-Film Circuits", *IEEE Transactions on Advanced Packaging*, vol. 28, No. 2, pp. 320-327, May 2005.

Ponchak et al., "The Use of Metal Filled Via Holes for Improving Isolation in LTCC RF and Wireless Multichip Packages", *IEEE Transactions on Advanced Packaging*, vol. 23, No. 1, pp. 88-99, Feb. 2000.

Papapolymerou et al., "Crosstalk Between Finite Ground Coplanar Waveguides Over Polyimide Layers for 3-D MMICs on Si Substrates", IEEE Transactions on Microwave Theory and Techniques, vol. 52, No. 4, pp. 1292-1301, Apr. 2004.

Mbairi et al., "On the Problem of Using Guard Traces for High Frequency Differential Lines Crosstalk Reduction", *IEEE Transactions on Components and Packaging Technologies*, vol. 30, No. 1, pp. 67-74, Mar. 2007.

"A Shared-Aperture Dual-Band Dual-Polarized Microstrip Array", Pozar, David M. et al., *IEEE Transactions on Antennas and Propagation*, vol. 49, No. 2, pp. 150-157, Feb. 2001.

"Characteristic of the Coplanar Waveguide to Microstrip Right-Angled Transition"; Maeng-Youl Lee et al., 3 pgs.

"Design and Characterization of the EBG Waveguide-Based Interconnects"; Asanee Suntives et al.; *IEEE Transactions on Advanced Packaging*, vol. 30, No. 2; pp. 163-170; May 2007.

"Simulation and Performance of Passive Millimeter Wave Coplanar Waveguide Circuit Devices"; S.D. Gedney et al.; *1997 Wireless Communications Conference*; pp. 27-31; May 1997.

"Three-Dimensional High-Frequency Distribution Networks—Part I: Optimization of CPW Discontinuities"; Thomas M. Weller; *IEEE Transactions on Microwave Theory and Techniques*, vol. 48, No. 10; pp. 1635-1642; Oct. 2000.

"Effects of Air-Bridges and Mitering on Coplanar Waveguide 90° Bends: Theory and Experiment"; A.A. Omar et al.; *1993 IEEE MTT-S Digest*; pp. 823-826; 1993.

"Design and Optimization of CPW Circuits Using EM-ANN Models for CPW Components"; Paul M. Watson et al.; *IEEE Transactions on Microwave Theory and Techniques*, vol. 45, No. 12; pp. 2515-2523; Dec. 1997.

"A European Low Cost MMIC Based Millimetre-Wave Radar Module for Automotive Applications", Mark Walden et al., 4 pages.

"Application of a Substrate-Lens Antenna Concept and SiGe Component Development for Cost-Efficient Automotive Radar", Denis Chouvaev et al., *Swedish National Testing and Research Institute, 34th European Microwave Conference*, Amsterdam, 2004, pp. 1417-1420.

"Advanced RF Frontend Technology Using Micromachined SiGe", *Information Society Technologies (IST Program*, 38 pages.

"Combined Feed Network for a Shared-Aperture Dual-Band Dual-Polarized Array", Vetharatnam et al., *IEEE Antennas and Wireless Propagation Letters*, vol. 4., pp. 297-299, 2005.

"Coupling Suppression in Microstrip Lines using a Bi-Periodically Perforated Ground Plane", *IEEE Microwave and Wireless Components Letters*, vol. 12, No. 5, pp. 169-171, May 2002.

U.S. Appl. No. 12/098,283, filed Apr. 4, 2008, Margomenos et al.

K. Schuler et al., Innovative Material Modulation for Multilayer LTCC Antenna at 76.5 GHz in Radar and Communication Applications; Proceedings of the 33rd European Microwave Conference, Munich Germany 2003; pp. 707-710; printed in the year 2003.

\* cited by examiner

DUAL-BAND ANTENNA ARRAY AND RF FRONT-END FOR AUTOMOTIVE RADARS

CLAIM OF PRIORITY UNDER 35 U.S.C. §120

The present Application for Patent claims priority from and is a continuation-in-part application of U.S. patent application Ser. No. 12/098,283, entitled "Three Dimensional Integrated Automotive Radars and Methods of Manufacturing the Same," filed Apr. 4, 2008, now U.S. Pat. No. 7,733,265, and assigned to the assignee hereof and hereby expressly incorporated by reference herein.

BACKGROUND

1. Field

The invention relates to low-cost three dimensional integrated automotive radars and methods of manufacturing the same. More particularly, the invention relates to a dual-band antenna array and RF front end for automotive radars where the RF front end combines a long range narrowband radar and a short range ultra-wideband radar.

2. Background

Automotive radar systems are currently being provided in many luxury automobiles. Over the past few years, automotive radar systems have been used with intelligent cruise control systems to sense and adjust the automobile's speed depending on traffic conditions. Today, automotive radar systems are being used with active safety systems to monitor the surroundings of an automobile for collision avoidance. Current automotive radar systems are divided into long range (for adaptive cruise control and collision warning) and short range (for pre-crash, collision mitigation, parking aid, blind spot detection, etc.). Two or more separate radar systems, for example, a 24 GHz short range radar system and a 77 GHz long range radar system, which are typically each 15×15×15 centimeters in dimensions, are used to provide long and short range detection.

Prior art automotive radar systems have several drawbacks. For example, since multiple prior art radar systems are separately mounted on a vehicle, significant space is needed and can be wasteful. The cost for packaging, assembling, and mounting each radar system increases due to the additional number of radar systems. In order for each radar system to work properly, the materials placed on top of each radar system needs to be carefully selected so that the materials are RF transparent. The cost for multiple radar systems is further increased because multiple areas of RF transparency are needed on the front, sides, and rear of the vehicle. Thus, increasing the number of radar systems increases the packaging, assembly, mounting, and materials costs.

Therefore, a need exists in the art for low-cost three dimensional integrated automotive radars having a dual-band antenna array and RF front-end that combines a long range narrowband radar and a short range ultra-wideband radar.

SUMMARY

The invention is a low-cost, compact 3-D integrated automotive radar that produces a dual-band antenna array and RF front-end that combines a long range narrowband radar (e.g., 77 GHz) and a short range ultra-wideband radar (e.g., 24 GHz). The compact 3-D integrated automotive radar significantly reduces manufacturing, assembling, and mounting costs. Furthermore, by using a 3-D RF assembly technique, the necessary number of connections and transitions between the antennas and the chips are minimized, therefore improving the noise and sensitivity of the radar. In addition, the compact 3-D integrated automotive radar reduces the space needed for mounting radar sensors on the vehicle (e.g., front and rear bumpers), wiring, and RF transparent materials in multiple locations on the vehicle.

In one embodiment, an automotive radar comprises a printed circuit board having a top surface and a bottom surface, a processor mounted on the bottom surface of the printed circuit board, a second liquid crystal polymer layer formed on the top surface of the printed circuit board, a second microstrip array printed on the second liquid crystal polymer layer, the second microstrip array having a patch, a first liquid crystal polymer layer formed on the second liquid crystal polymer layer, a first microstrip array printed on the first liquid crystal polymer layer, the first microstrip array having a perforated patch, and a transmit/receive module connected to a bottom surface of the second liquid crystal polymer layer and configured to transmit a first frequency signal to the first microstrip array and a second frequency signal to the second microstrip array.

In another embodiment, an automotive radar comprises a printed circuit board having a top surface, a bottom surface, and a cavity, a lower layer having a plurality of patches, the lower layer being positioned on the top surface of the printed circuit board, and a lower microstrip feed connected to the plurality of patches and positioned on the lower layer. The automotive radar also comprises an upper layer having a patch with a plurality of perforations that expose the plurality of patches, the upper layer being positioned on the lower layer, an upper microstrip feed connected to the patch and positioned on the upper layer, and a transmit module positioned in the cavity of the printed circuit board and configured to transmit a first signal having a first frequency to the upper microstrip feed and a second signal having a second frequency to the lower microstrip feed.

BRIEF DESCRIPTION OF THE DRAWINGS

The features, objects, and advantages of the invention will become more apparent from the detailed description set forth below when taken in conjunction with the drawings, wherein.

DETAILED DESCRIPTION

Apparatus, systems and methods that implement the embodiments of the various features of the invention will now be described with reference to the drawings. The drawings and the associated descriptions are provided to illustrate some embodiments of the invention and not to limit the scope of the invention. Throughout the drawings, reference numbers are re-used to indicate correspondence between referenced elements. For purposes of this disclosure, the term "patch" may be used synonymously with the term "antenna."

Figure 1:
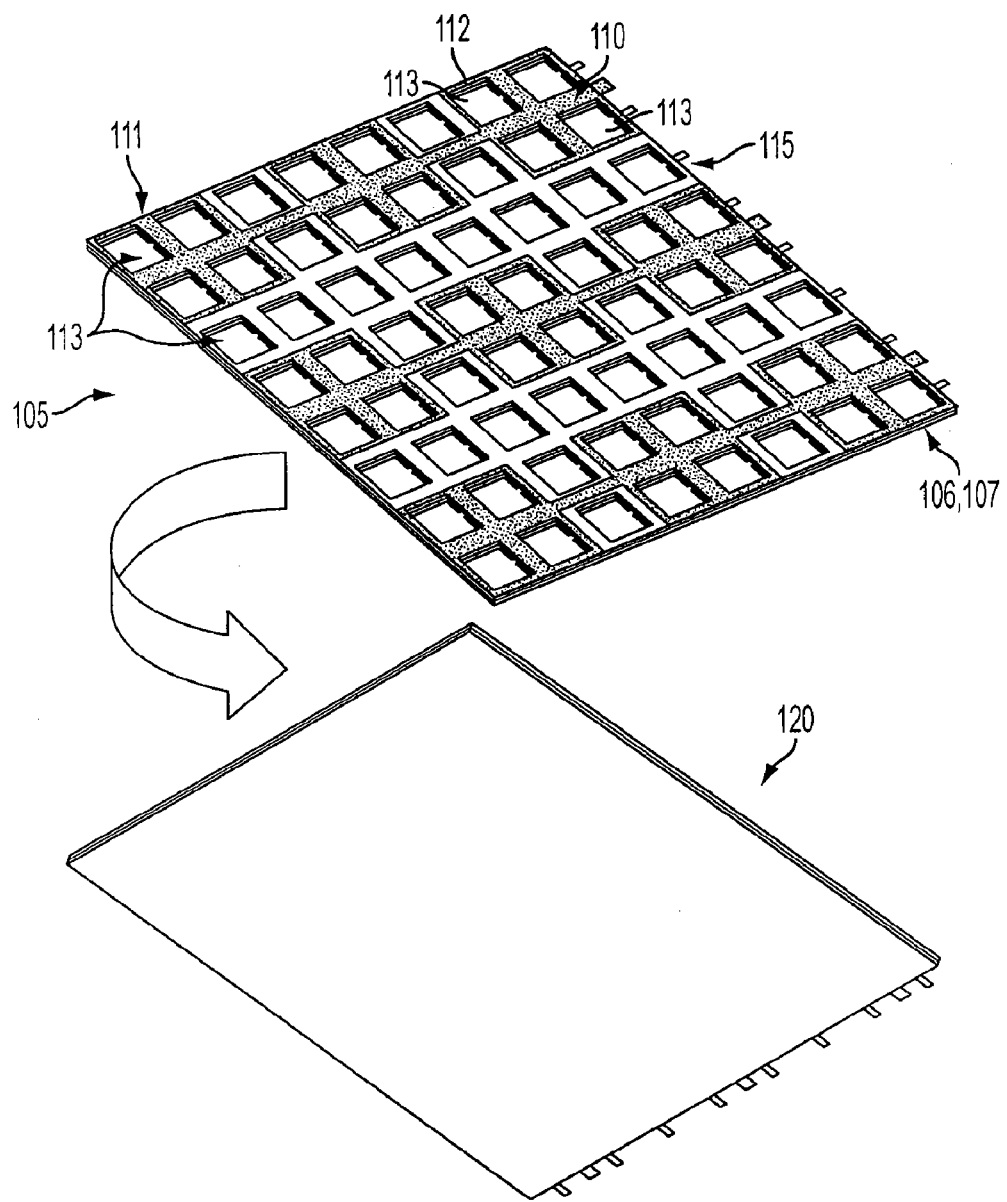
FIGS. 1, 2, and 3 are perspective, top, and exploded views, respectively, of a low-cost, compact radar that utilizes a three-dimensional integrated architecture having a dual band array made of at least two bonded layers positioned on a common ground plane according to an embodiment of the invention.
Figure 2:
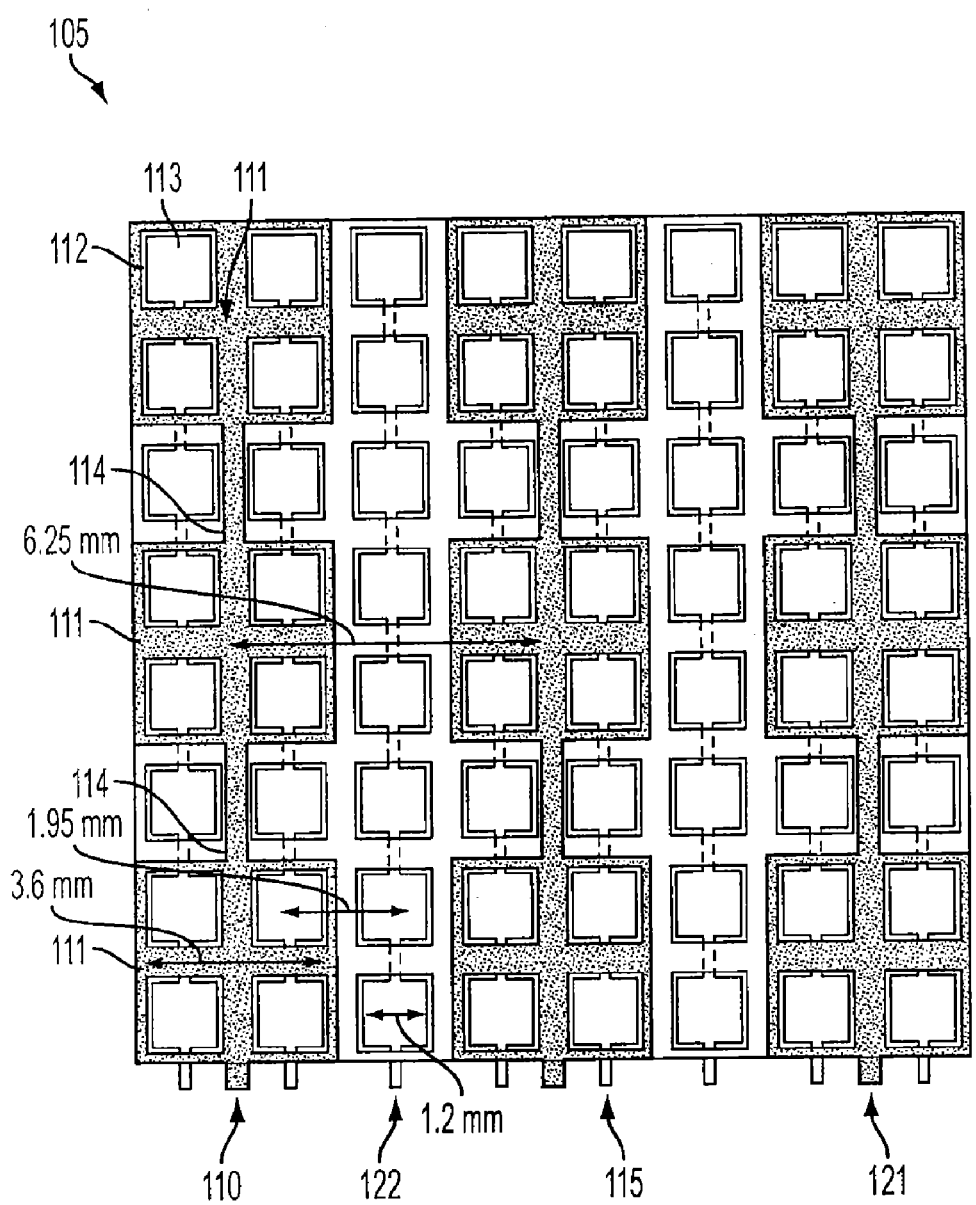
Figure 3:
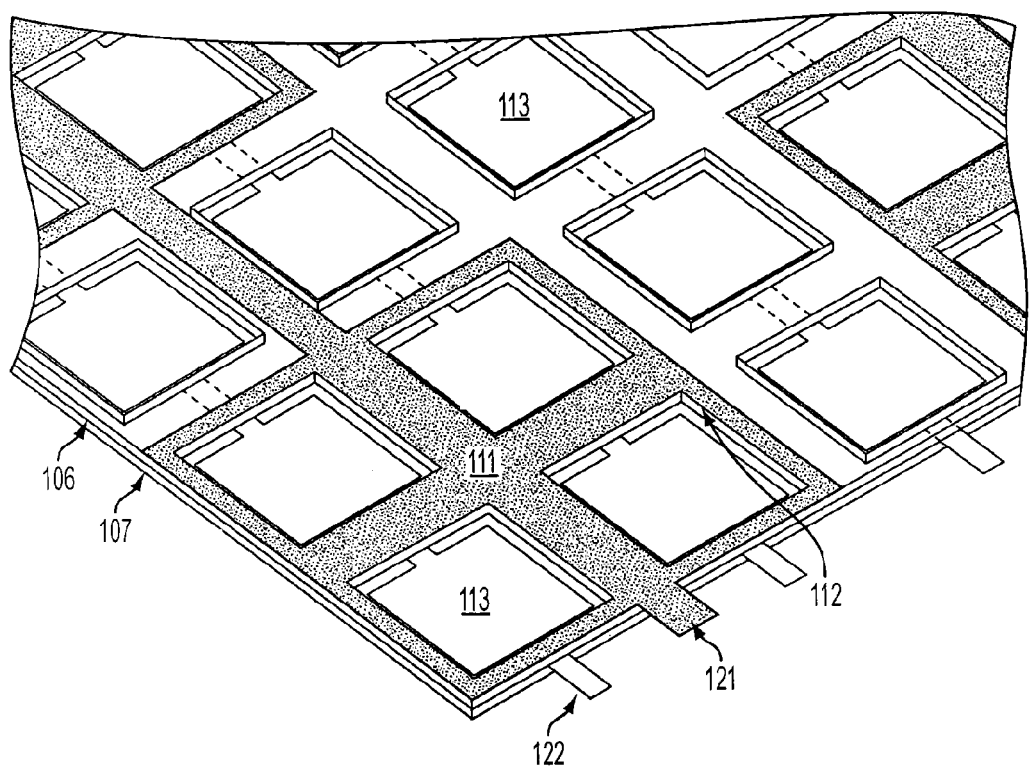

FIGS. 1, 2, and 3 are perspective, top, and exploded views, respectively, of a low-cost, compact radar 100 that utilizes a three-dimensional integrated architecture having a dual band array 105 made of at least two bonded layers 106 and 107 positioned on a common ground plane 120 according to an embodiment of the invention. The dual band array 105 includes a first layer 106 (e.g., a top or upper layer) and a second layer 107 (e.g., a lower layer). In one embodiment, the first layer 106 and the second layer 107 are bonded together and are each approximately 4 mils thick. The first layer 106 and the second layer 107 can be made of a liquid crystal polymer (LCP), a low temperature cofired ceramic (LTCC), a Parylene N dielectric, a polytetrafluoroethylene (PTFE) ceramic, a PTFE glass fiber material or any other material that can produce thin (about 2-4 mils in thickness) metallized layers which can be stacked to form multi-layer architectures. The radar 100 may be implemented using hardware, software, firmware, middleware, microcode, or any combination thereof. One or more elements can be rearranged and/or combined, and other radars can be used in place of the radar 100 while still maintaining the spirit and scope of the invention. Elements may be added to the radar 100 and removed from the radar 100 while still maintaining the spirit and scope of the invention.

The first layer 106 has a series microstrip patch array 110 for 24 GHz operation. The patch array 110 includes one or more perforated patches 111 (i.e., antennas) where each hole or opening 112 is an approximately 1.4 millimeter square opening which uncovers a 77 GHz patch 113 (i.e., an antenna) located at or on the second layer 107, which has a series microstrip patch array 115 for 77 GHz operation. The 77 GHz series microstrip patch array 115 may be printed on the second layer 107. In one embodiment, each perforated patch 111 is an approximately 3.6 millimeter square and each patch 113 is an approximately 1.2 millimeter square. The patches 111 are connected to one another via connectors 114. The size of each opening 112 is optimized to have minimum effects on the radiation performance of the patches 111 and 113.

In order to ensure no grating lobes and low side lobe level, the spacing between the first patch array 110 and the second patch array 115 is $\lambda_0/2$, where $\lambda_0$ is the free space wavelength at 24 GHz and 77 GHz, respectively. Due to the ratio between the two frequencies (77/24≈3), four 77 GHz patches 113 are placed inside or within the outer boundaries of one 24 GHz patch 111. In addition, two 77 GHz patches 113 are placed between two adjacent 24 GHz patches 111.

Figure 4:
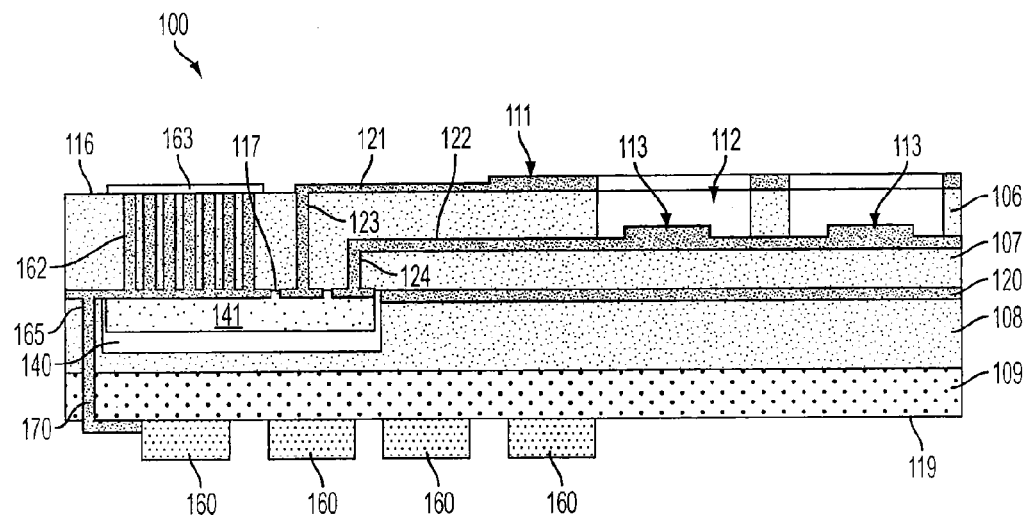
FIG. 4 is a cross-sectional view of a 3-D integrated dual-band RF front end of a radar formed on a printed circuit board (PCB) according to an embodiment of the invention.

FIG. 4 is a cross-sectional view of a 3-D integrated dual-band RF front end of a radar 100 formed on a printed circuit board (PCB) 109 according to an embodiment of the invention. In one embodiment, a packaging layer 108 is formed on the PCB 109. The packaging layer 108 is made of LCP and is used for packaging the T/R module 141. For example, the packaging layer 108 may have a cavity 140 for holding the T/R module 141. In addition, IF filters may be embedded in or fabricated on the packaging layer 108. In one embodiment, the TIR module 141 may be used for both or multiple frequencies.

The second layer 107 may be formed between the 77 GHz array 113 and the T/R module ground 120. The array of second patches 113 are formed on top of or are part of the second layer 107. The microstrip feed 122 connects the array of second patches 113 to the TIR module 141. The microstrip feed 122 is transitioned through a second via 124 to the T/R module 141. The first layer 106 may be formed on top of the microstrip feed 122 and/or the second layer 107. An array of first perforated patches 111 (e.g., 24 GHz patches) are formed on top of or are part of the first layer 106. The perforations 112 on the first layer 106 allow relatively unhindered radiation to pass from the array of second patches 113 (e.g., 77 GHz patches). In one embodiment, each perforation 112 is a horn-shaped opening (i.e., a lower portion of the horn is smaller in circumference than an upper portion of the horn), which improves the radiation performance of each patch 113. The microstrip feed 121 connects the array of first patches 111 to the T/R module 141. The microstrip feed 121 is transitioned through a first via 123 to the T/R module 141 and may be formed on or may be part of the first layer 106. The first layer 106 may contain the 24 GHz series patch array 110 and the microstrip feed 121. The microstrip feed 121 and the microstrip feed 122 may include a network of feed connectors or lines.

The first layer 106 has one or more microstrip feeds 121 and the second layer 107 has one or more microstrip feeds 122. The microstrip feeds 121 and 122 are used as connections to the first and second layers 106 and 107, respectively. In one embodiment, the patch arrays 110 and 115 are comprised of microstrip patch antennas.

A plurality of chips and/or components 160 (e.g., two Silicon-Germanium (SiGe) BiCMOS chips) may be mounted on a bottom surface 119 of the PCB 109. The plurality of chips and/or components 160 may include one or more of the following: a digital signal processor (DSP), a digital clock, a temperature controller, a memory, a microprocessor, dynamic link libraries, a DC port, a data port, a voltage controlled oscillator, a PLL, etc. The plurality of chips and/or components 160 may be connected to one another via wireless links or via connectors, traces or wires on the PCB 109. The output signals 170 (e.g., digital, DC, IF or RF signals) from the T/R module 141 may be directly connected using through-vias 165 (or may be wirelessly connected) to the plurality of chips and/or components 160.

The T/R module 141 may be flip-chip bonded or mounted on a bottom surface 117 of the second layer 107. The flip-chip transition provides significantly less parasitic inductance and lower loss compared to conventional wirebonds. A plurality of thermal vias 162 are directly connected to the T/R modules 141 and pass through the first and second layers 106 and 107. The plurality of thermal vias 162 are used to remove the heat from the T/R module 141 and transfer the heat to a heat rejection area 163 that is located on a top surface 116 of the first layer 106.

Figure 5:
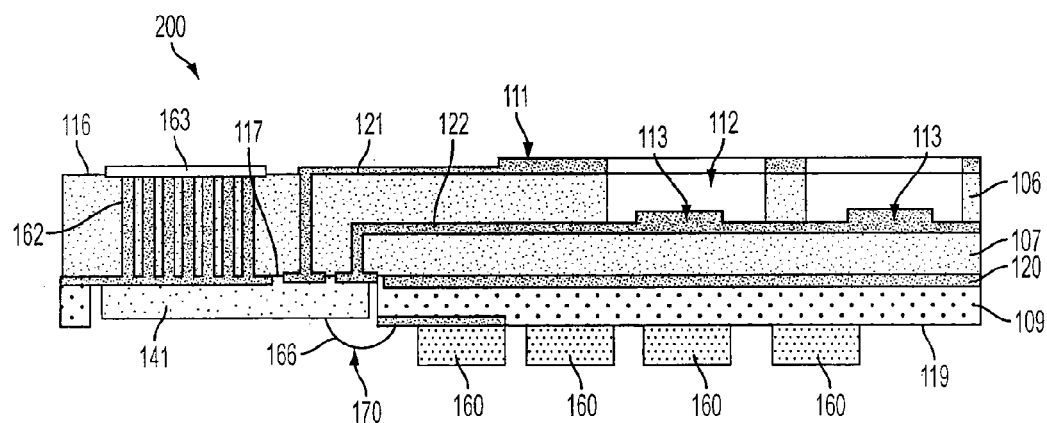
FIG. 5 is a cross-sectional view of a 3-D integrated dual-band RF front end of a radar where the second layer is directly mounted to the PCB and a packaged T/R module is flip-chip mounted to a bottom surface of the second layer according to another embodiment of the invention.

FIG. 5 is a cross-sectional view of a 3-D integrated dual-band RF front end of a radar 200 where the second layer 107 is directly mounted to the PCB 109 and a packaged T/R module 141 is flip-chip mounted to a bottom surface 117 of the second layer 107 according to another embodiment of the invention. The output signals 170 (e.g., digital, DC, IF or RF signals) from the packaged T/R module 141 may be directly connected using wirebonds 166 (or may be wirelessly connected) to the plurality of chips and/or components 160. In this embodiment, the T/R module 141 is pre-packaged so no additional LCP layer (such as 108 in FIG. 4) is needed.

Figure 6A:
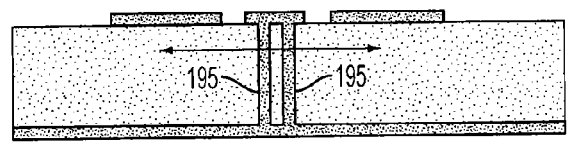
FIGS. 6A and 6B are cross-sectional and top views, respectively, of via fences that are used to provide isolation between the first patch array and the second patch array according to an embodiment of the invention.
Figure 6B:
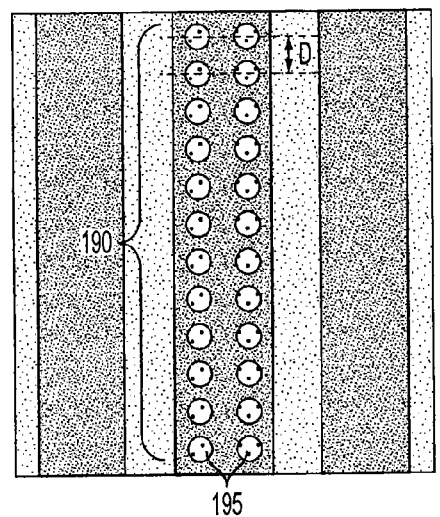

FIGS. 6A and 6B are cross-sectional and top views, respectively, of via fences 190 (i.e., a number of vias 195 positioned along a line) that are used to provide isolation between the first patch array 110 and the second patch array 115 according to an embodiment of the invention. The via fences 190 are used to ensure high isolation between the two frequencies. The vias 195 can also be spaced apart a distance D, where D can be varied in order to form bandgap filters. In addition to vias 195, periodic structures can be etched on the ground plane 120 in order to create bandgap effects. The result of these bandgap effects is that we can filter out the 24 GHz signals on the 77 GHz transmission line and vice versa.

Figure 7:
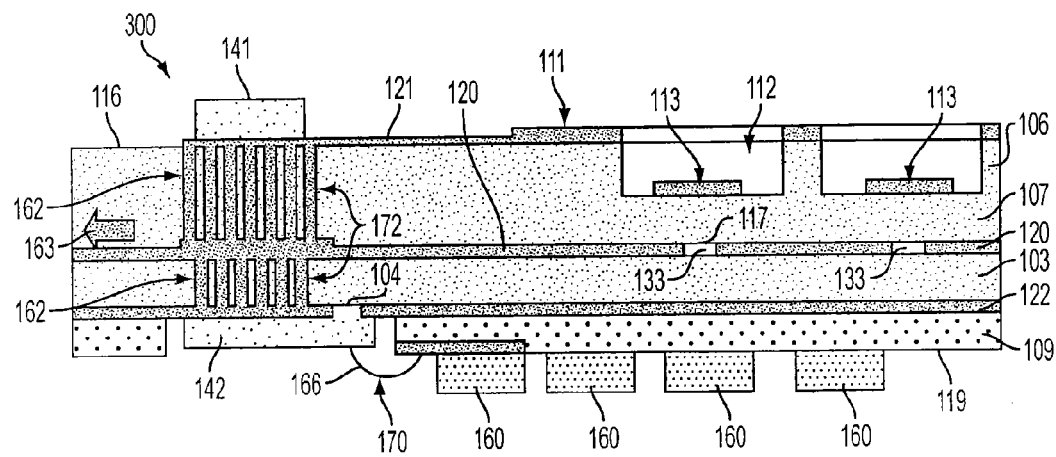
FIG. 7 is a cross-sectional view of a 3-D integrated dual-band RF front end of a radar having a 77 GHz aperture feed array that is positioned under the 77 GHz patch array according to another embodiment of the invention.

FIG. 7 is a cross-sectional view of a 3-D integrated dual-band RF front end of a radar 300 having a 77 GHz aperture feed array 133 that is positioned under the 77 GHz patch array 115 according to another embodiment of the invention. In particular, a plurality of apertures 133 are formed on the ground plane 120 and each aperture 133 is formed below or under a 77 GHz patch 113. The ground plane 120 is formed or positioned on the bottom surface 117 of the second layer 107. In one embodiment, the 77 GHz aperture feed array 133 replaces the location of the 77 GHz microstrip feed array 122 and the 77 GHz microstrip feed array 122 is mounted or printed on a bottom surface 104 of a third layer 103. The third layer 103 may be similar to the first and second layers 106 and 107. Therefore, the ground plane 120 separates the 24 GHz patch array 110 from the 77 GHz patch array 115, thus minimizing or reducing the crosstalk between the 24 GHz lines and the 77 GHz lines.

The microstrip feed 121 is used to connect the first layer 106 to a first (e.g., 24 GHz) transmit/receive (T/R) module 141 and the microstrip feed 122 is used to connect the second layer 107 to a second (e.g., 77 GHz) T/R module 142. The first T/R module 141 may be formed or positioned on a top surface 116 of the first layer 106 and connected to the first microstrip feed 121. The second T/R module 142 may be formed or positioned on a bottom surface 104 of the third layer 103 and connected to the second microstrip feed 122. The first T/R module 141 is connected to the plurality of chips and/or components 160 using vias 172 and the second T/R module 142 is connected to the plurality of chips and/or components 160 using wirebonds 166. Thermal straps 162 are used to remove the heat from the first and second T/R modules 141 and 142 and transfer the heat to the heat rejection area 163 that is located on a side of the radar 300.

The patch array 110, through for example a microstrip-based distribution network, is connected to the first T/R module 141 and the patch array 115, through for example a microstrip-based distribution network, is connected to the second T/R module 142. The first and second T/R modules 141 and 142 may be a T/R monolithic microwave integrated circuit (MMIC) or a Silicon-Germanium (SiGe) BiCMOS chip that may include one or more of the following: a T/R switch, a low noise amplifier (LNA), a variable gain amplifier (VGA), a power amplifier (PA), a phase shifter, a mixer, an intermediate frequency (IF) amplifier, and an analog-to-digital (A/D) converter. The first and second T/R modules 141 and 142 may be combined together into a single T/R module 141. The first T/R module 141 may generate first frequency signals (e.g., 24 GHz signals) and the second T/R module 142 may generate second frequency signals (e.g., 77 GHz signals). Alternatively, one or more of the chips or components 160 described below can generate the first and second frequency signals.

Those of ordinary skill would appreciate that the various illustrative logical blocks, modules, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosed apparatus and methods.

The various illustrative logical blocks, modules, and circuits described in connection with the examples disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an Application Specific Integrated Circuit (ASIC). The ASIC may reside in a wireless modem. In the alternative, the processor and the storage medium may reside as discrete components in the wireless modem.

The previous description of the disclosed examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The described embodiments are to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. An automotive radar comprising:
    a printed circuit board having a top surface and a bottom surface;
    a processor mounted on the bottom surface of the printed circuit board, the processor configured to generate a first frequency signal and a second frequency signal;
    a second liquid crystal polymer layer formed on the top surface of the printed circuit board;
    a second microstrip array printed on the second liquid crystal polymer layer, the second microstrip array having a patch;
    a first liquid crystal polymer layer formed on the second liquid crystal polymer layer;

a first microstrip array printed on the first liquid crystal polymer layer, the first microstrip array having a perforated patch; and a transmit/receive module connected to a bottom surface of the second liquid crystal polymer layer, connected to the processor, and configured to transmit the first frequency signal to the first microstrip array and the second frequency signal to the second microstrip array.

2. The automotive radar of claim 1 wherein the patch is positioned directly underneath the perforated patch.

3. The automotive radar of claim 1 wherein the transmit/receive module is flip-chip mounted to the bottom surface of the second liquid crystal polymer layer.

4. The automotive radar of claim 1 further comprising a plurality of thermal vias directly connected to the transmit/receive module to remove heat from the transmit/receive module.

5. The automotive radar of claim 1 wherein the patch is located within the outer boundaries of the perforated patch.

6. The automotive radar of claim 1 wherein the first liquid crystal polymer layer is bonded to the second liquid crystal polymer layer.

7. The automotive radar of claim 1 wherein the second frequency signal is transmitted from the patch through the perforated patch.

8. The automotive radar of claim 1 wherein the transmit/receive module includes a first transmit/receive module for transmitting the first frequency signal and a second transmit/receive module for transmitting the second frequency signal.

9. The automotive radar of claim 1 wherein the first frequency signal is approximately 24 GHz and the second frequency signal is approximately 77 GHz.

10. The automotive radar of claim 1 wherein the perforated patch is formed in the shape of a horn where a lower portion of the horn is smaller in circumference than an upper portion of the horn.

11. The automotive radar of claim 1 wherein the transmit/receive module is a SiGe BiCMOS chip.

12. The automotive radar of claim 11 further comprising a voltage controlled oscillator integrated on the SiGe BiCMOS chip and ground vias and split grounding planes to isolate noise created by the voltage controlled oscillator.

13. The automotive radar of claim 1 wherein the transmit/receive module is a silicon CMOS chip.

14. An automotive radar comprising:
a printed circuit board having a top surface and a bottom surface;
a packaging layer having a cavity and positioned on the top surface of the printed circuit board;
a lower layer having a plurality of patches, the lower layer being positioned on the packaging layer;
a lower microstrip feed connected to the plurality of patches and positioned on the lower layer;
an upper layer having a patch with a plurality of perforations that expose the plurality of patches, the upper layer being positioned on the lower layer;
an upper microstrip feed connected to the patch and positioned on the upper layer; and
a transmit module positioned in the cavity of the packaging layer and configured to transmit a first signal having a first frequency to the upper microstrip feed and a second signal having a second frequency to the lower microstrip feed.

15. The automotive radar of claim 14 wherein the packaging layer, the lower layer, and the upper layer are each made of a material selected from a group consisting of a liquid crystal polymer, a low temperature cofired ceramic, a Parylene-N dielectric, a PTFE ceramic, and a PTFE glass fiber material.

16. The automotive radar of claim 14 wherein the transmit module is selected from a group consisting of a SiGe BiCMOS chip and a silicon CMOS chip.

17. The automotive radar of claim 14 wherein the second signal is transmitted from the plurality of patches through the plurality of perforations.

18. The automotive radar of claim 14 wherein the transmit module includes a first transmit module for transmitting the first signal and a second transmit module for transmitting the second signal.

19. The automotive radar of claim 14 wherein the first frequency is approximately 24 GHz and the second frequency is approximately 77 GHz.

20. The automotive radar of claim 14 further comprising a plurality of thermal vias directly connected to the transmit module to remove heat from the transmit module.

21. An automotive radar comprising:
a printed circuit board having a top surface, a bottom surface, and a cavity;
a lower layer having a plurality of patches, the lower layer being positioned on the top surface of the printed circuit board;
a lower microstrip feed connected to the plurality of patches and positioned on the lower layer;
an upper layer having a patch with a plurality of perforations that expose the plurality of patches, the upper layer being positioned on the lower layer;
an upper microstrip feed connected to the patch and positioned on the upper layer; and
a transmit module positioned in the cavity of the printed circuit board and configured to transmit a first signal having a first frequency to the upper microstrip feed and a second signal having a second frequency to the lower microstrip feed.

* * * * *